(12) United States Patent
Nishimura

(10) Patent No.: US 7,790,614 B2
(45) Date of Patent: Sep. 7, 2010

(54) SEMICONDUCTOR DEVICE AND METHOD OF MANUFACTURING THE SAME

(75) Inventor: Takaharu Nishimura, Yokkaichi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 232 days.

(21) Appl. No.: 12/030,960

(22) Filed: Feb. 14, 2008

(65) Prior Publication Data
US 2008/0138977 A1 Jun. 12, 2008

Related U.S. Application Data

(62) Division of application No. 11/387,972, filed on Mar. 24, 2006, now Pat. No. 7,358,613.

(30) Foreign Application Priority Data

Mar. 25, 2005 (JP) ............................. 2005-088498

(51) Int. Cl.
  *H01L 21/322* (2006.01)
(52) U.S. Cl. .................... 438/672; 438/624; 438/637
(58) Field of Classification Search .................. 438/622, 438/624, 637, 641, 672
  See application file for complete search history.

(56) References Cited

U.S. PATENT DOCUMENTS 5,310,700 A * 5/1994 Lien et al. .................. 438/618
6,300,242 B1 * 10/2001 Ueda et al. .................. 438/638
6,762,120 B2    7/2004 Nakagawa et al.

FOREIGN PATENT DOCUMENTS

| JP | 10-229121   | 8/1998 |
| JP | 2000-091426 | 3/2000 |
| JP | 2001-217310 | 8/2001 |
| JP | 2002-158280 | 5/2002 |
| JP | 2004-193431 | 7/2004 |

* cited by examiner

*Primary Examiner*—Leonardo Andújar
(74) *Attorney, Agent, or Firm*—Oblon, Spivak, McClelland, Maier & Neustadt, L.L.P.

(57) ABSTRACT

A method of manufacturing a semiconductor device includes forming on a lower insulating layer first to third electrically conducting layers sequentially, forming a mask pattern on the third conducting layer, dry-etching the first to third conducting layers with the mask pattern as a mask, thereby dividing the conducting layers, and forming an insulating layer between the adjacent second conducting layers by an HDP-CVD process so that a void is defined so as to be located lower than an interface between the first and second conducting layers and higher than an interface between the second and third conducting layers so as to have a sectional area larger than the second conducting layer. The forming of the insulating layer by the HDP-CVD process includes burying the insulating layer and sputtering to spread a frontage of a buried region buried by the burying process, both burying and sputtering being repeated alternately.

8 Claims, 5 Drawing Sheets

SEMICONDUCTOR DEVICE AND METHOD OF MANUFACTURING THE SAME

CROSS-REFERENCE TO RELATED APPLICATIONS

This application is a divisional of U.S. application Ser. No. 11/387,972, filed Mar. 24, 2006, and is based upon and claims the benefit of priority from the prior Japanese Patent Application No. 2005-88498, filed on Mar. 25, 2005, the entire contents of both of which are incorporated herein by reference.

BACKGROUND OF THE INVENTION

1. Field of the Invention

The present invention relates to a semiconductor device having a void formed between wiring layers and a method of manufacturing the semiconductor device.

2. Description of the Related Art

Growing refinement of semiconductor devices has recently caused a problem of increase in a capacity between wiring layers. To overcome the problem, JP-A-10-229121 discloses a method in which a void is made between wiring layers so as to reach a region lower than the underside of the wiring.

According to the method disclosed by JP-A-10-229121, a trench is firstly formed in an interlayer insulating film constituting a lower layer, and subsequently, a wiring layer is deposited. The wiring layer is etched along the trench so that a wiring pattern is formed. Lastly, an interlayer insulating film is deposited between the wiring patterns so that a void is formed so as to extend from an upper end to an entire lower end of the wiring pattern, whereby a capacity between the wiring layers is reduced.

As obvious from the above-mentioned document, the capacity between the wiring layers can be reduced to some degree when a void is formed so as to extend from an upper end to an entire lower end of the wiring pattern. However, a further reduction in the capacity between the wiring layers has been desired with progress in the refinement of elements.

SUMMARY OF THE INVENTION

Therefore, an object of the present invention is to provide a method of manufacturing a semiconductor device which can reduce the capacity between wiring layers.

There is provided a method of manufacturing a semiconductor device, comprising forming on a lower insulating layer first to third electrically conducting layers sequentially and a protective insulating layer when necessary; forming a mask pattern on the third conducting layer or the protective insulating layer; dry-etching the first to third conducting layers with the mask pattern serving as a mask, thereby dividing the conducting layers; and forming an insulating layer between the adjacent second conducting layers by an HDP-CVD process so that a void is defined so as to be located lower than an interface between the first and second conducting layers and higher than an interface between the second and third conducting layers so as to have a sectional area larger than the second conducting layer, wherein the forming of the insulating layer by the HDP-CVD process includes burying the insulating layer and sputtering thereby to spread a frontage of a buried region which has been buried by the burying process, both burying and sputtering being repeated alternately.

There is also provided a method of manufacturing a semiconductor device, comprising forming a first insulating film; forming a first barrier metal layer on the first insulating film; forming a metal layer on the first barrier metal layer; forming a second barrier metal layer on the metal layer; etching the second barrier metal layer, the metal layer, the first barrier metal layer and the first insulating film by a dry etching method so that a plurality of wiring patterns are formed; etching the wiring patterns by a wet etching method so that a reactive product is removed, so that a first width of an upper end of the metal layer is smaller than a second width of a lower end of the second barrier metal layer and so that a third width of a lower end of the metal layer is smaller than a fourth width of an upper end of the first barrier metal layer; and forming a third insulating film between the wiring patterns so that a void is formed between the wiring patterns, wherein the void is defined so as to be located lower than an interface between the first barrier metal layer and the metal layer and higher than an interface between the metal layer and the second barrier metal layer; and wherein the forming of the third insulating film includes burying the third insulating layer and sputtering thereby to spread a frontage of a buried region which has been buried by the burying process, both burying and sputtering processes being repeated alternately.

BRIEF DESCRIPTION OF THE DRAWINGS

Other objects, features and advantages of the present invention will become clear upon reviewing the following description of the embodiment with reference to the accompanying drawings, in which.

DETAILED DESCRIPTION OF THE INVENTION

Figure 1:
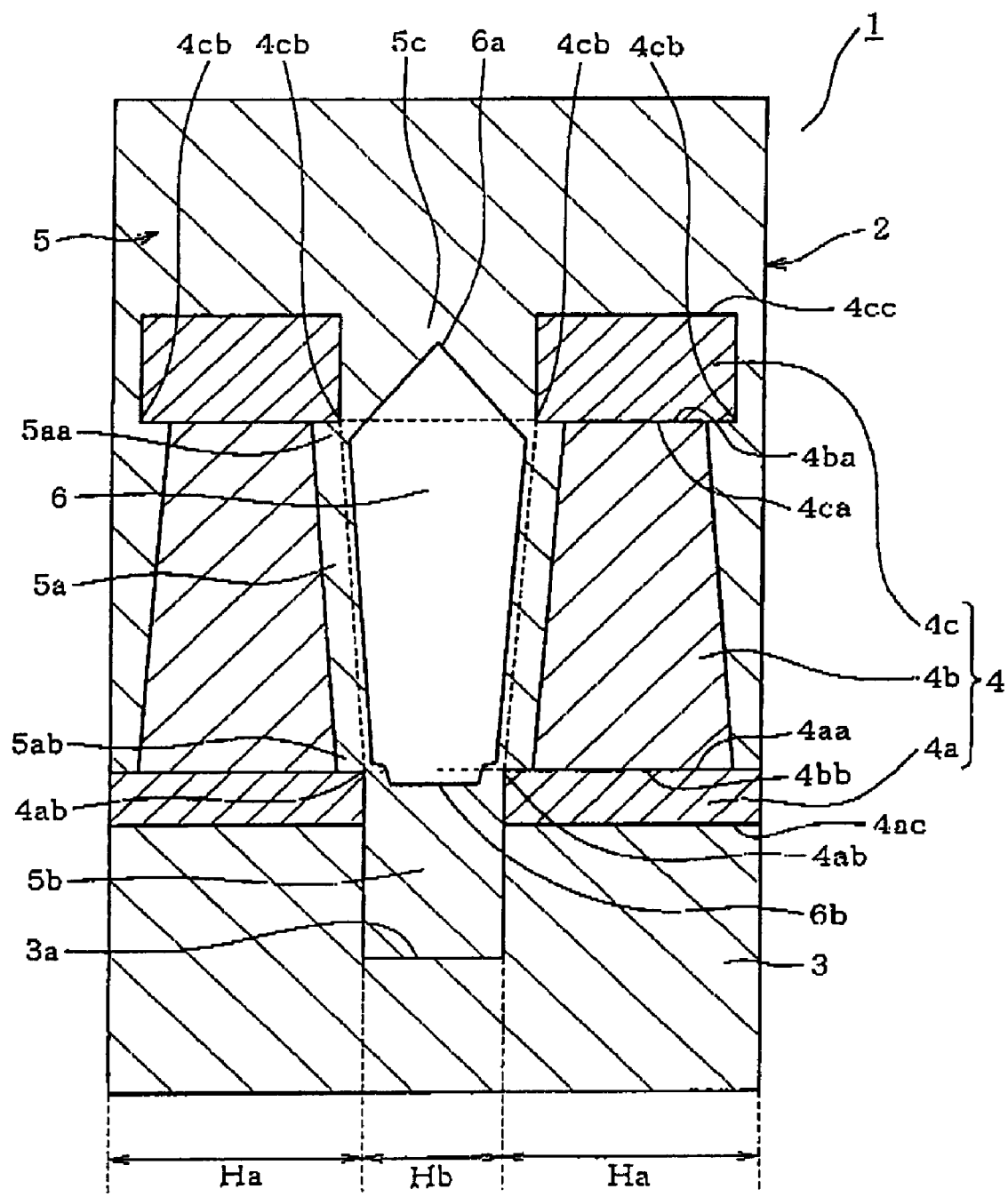
FIG. 1 is a schematic sectional view of wirings in a semiconductor device in accordance with one embodiment of the present invention.

One embodiment of the invention will be described with reference to the accompanying drawings. Referring to FIG. 1, the structure of a plurality of adjacent wirings is shown schematically. A semiconductor device 1 has a wiring structure 2 as shown in FIG. 1. The wiring structure 2 includes a lower-layer-side insulating layer 3 and a plurality of wirings 4 disposed in parallel with each other so that the wirings 4 are adjacent to each other in a horizontal direction. The wiring structure 2 further includes an insulating layer 5 which is formed between the adjacent wirings 4 so as to insulate the wirings 4 electrically and a void 6 which is formed so as to be covered with the insulating layer 5 between the adjacent wirings 4.

The lower-layer-side insulating layer 3 is formed by a silicon oxide ($SiO_2$) film, for example. The insulating layer 3 has an upper side with a plane wiring forming region Ha. An insulation region Hb is formed between the wiring forming regions Ha both adjacent thereto. A trench 3a is formed in the insulating layer 3 in the insulation region Hb.

The wiring 4 is made of an electrically conductive material and includes a lower-layer-side barrier metal layer 4a (auxiliary wiring) formed on the insulating layer 3 in the wiring forming region Ha, a metal wiring layer 4b (main wiring) formed on the barrier metal layer 4a and an upper-layer-side barrier metal layer 4c (auxiliary wiring) formed on the metal wiring layer 4b.

The barrier metal layer 4a is formed by a laminated structure (not shown) of titanium (Ti) and titanium nitride (TiN) and has an upper side 4aa (corresponding to a third side) and an underside (corresponding to a fourth side), both of which sides are planar. The metal wiring layer 4b is made from, for example, Al, Al—Cu or Al—Si—Cu and is formed into a trapezoidal shape having a longitudinal section that is upwardly convex.

The metal wiring layer 4b has an upper side 4ba (corresponding to a second side; and upper forming face) formed into a plane. The metal wiring layer 4b further has a lower side 4bb (corresponding to a first side; and lower forming face) formed into a plane. The upper and lower sides 4ba and 4bb of the metal wiring layer 4b are opposed to each other. The upper side 4ba has a narrower forming region than the lower side 4bb.

Furthermore, the metal wiring layer 4b has a lower side 4bb formed into a plane. The lower side 4bb has a narrower forming region than the upper side 4aa. The barrier metal layer 4a has an end 4ab which is formed so as to protrude outside the forming side of the lower side 4bb of the metal wiring layer 4b. A width between the ends 4ab of the barrier metal layers 4a is set at a predetermined value (90 nm, for example).

The barrier metal 4c is formed by a laminated structure (not shown) of titanium (Ti) and titanium nitride (TiN) so as to come into contact with the upper side 4ba of the metal wiring layer 4b and so as to cover the upper side 4ba. The barrier metal layer 4c has a lower side 4ca (corresponding to a fifth side) and an upper side 4cc (corresponding to a sixth side) both of which are formed so as to be opposed to each other. Each of the lower and upper sides 4ca and 4cc is formed into a plane.

The barrier metal layer 4c is formed so that the lower side 4ca comes into contact with the upper side 4ba of the metal wiring layer 4b. The barrier metal layer 4c is further formed so as to protrude outward from ends of a forming side of the upper side 4ba. The barrier metal layer 4c is formed on the upper side 4ba of the metal wiring layer 4b so as to have a rectangular longitudinal section. The barrier metal layer 4c further has an end 4cb protruding outward from an end of the forming side of the upper side 4ba of the metal wiring layer 4b so as to have the shape of a hood. A width between the ends 4cb of the barrier metal layers 4c is set at a predetermined value (70 nm, for example).

The insulating layer 5 is made from tetra ethoxy silane (TEOS) and includes a thin film portion 5a formed thin so as to be adherent along an outer face (an outer wall face, for example) of the metal wiring layer 4b, a buried portion 5b buried in the trench 3a of the insulating region Hb and an upper forming portion 5c formed on the upper side of the wiring 4.

The thin film portion 5a is formed so as to have a substantially constant film thickness (uniform film thickness; and for example, 13 nm) relative to a side wall of the metal wiring layer 4b. The thin film portion 5a is formed along a lengthwise side wall of the metal wiring layer 4b. The thin film portion 5a has an upper end 5aa which is formed so as to be adherent closely to an upper side of the metal wiring layer 4b under the end 4c of the barrier metal 4c. Thus, the thin film portion 5a is desired to be formed so as to have a constant film thickness since the void 6 can be rendered larger.

The whole periphery of the void 6 is covered with the insulating layer 5 so that an interior thereof is vacuum. More specifically, an upper side of the void 6 is covered with the upper forming portion 5c of the insulating layer 5. The middle side of the void 6 is covered with the thin film portion 5a of the insulating layer 5. The lower side of the void 6 is covered with the buried portion 5b of the insulating layer 5.

The void 6 has an upper end 6a located upper than the forming side of the lower side 4ca of the barrier metal layer 4c. Furthermore, the upper end 6a of the void 6 is located lower than the upper side of the wiring 4 (the upper side 4cc of the barrier metal layer 4c). At least a part of the void 6 is located upper than an interface between the metal wiring layer 4b and the barrier metal layer 4c. Furthermore, a lower end 6b of the void 6 is located upper than the underside of wiring portion 4 (the underside of the barrier metal layer 4a). Still furthermore, the lower end 6b is located lower than the forming side of the upper side 4aa of the barrier metal layer 4a. Additionally, at least a part of the void 6 is formed lower than the interface between the metal wiring layer 4b and the barrier metal layer 4a. The void 6 is formed so as to be held between two adjacent wirings 4.

The aforesaid structure of the embodiment has the following characteristics. Each of a plurality of wirings 4 includes the metal wiring layer 4b, the barrier metal layer 4a protruding outward from the end of the underside 4bb and formed so as to have a rectangular section under the metal wiring layer 4b, and the barrier metal layer protruding outward from the upper side of the metal wiring layer 4b so as to be formed into the shape of a hood. In this case, the void 6 is formed between the wirings 4 and includes a part of the outer peripheral side thereof formed higher than the interface between the barrier metal layer 4c and the metal wiring layer 4b and another part of the outer peripheral side thereof formed lower than the interface between the barrier metal layer 4a and the metal wiring layer 4b. As a result, the sectional area of the void 6 is increased as compared with the conventional structure.

Examinations have been made in order that the size of the void 6 formed between the adjacent wirings 4 may be reduced. However, the void 6 completely disappears or remains small due to affections of variations in the manufacturing process. With recent reduction in the design rules, the value of the capacity between the adjacent wirings 4 has been increased such that the variations in a delay time of circuit operation cannot be ignored.

Since the void 6 is formed larger in the embodiment than in the conventional structure, the value of the capacity between the adjacent wirings 4 is rendered smaller than in the conventional structure. Consequently, delay in the circuit operation can be prevented even when a circuit is configured using the wiring 4.

The size of the void 6 has conventionally been reduced in the formation of the insulating layer 5 between the wiring 4. Accordingly, the void 6 completely disappears or remains small but is formed in various sizes. As a result, the value of the capacity differs among paired wirings 4 depending upon presence or absence of the void 6. The variations in the capacity value are formerly so small that the variations can be ignored in the circuit design. However, the variations cannot recently be ignored with reduction in the design rules.

The capacity value between the adjacent wirings 4 depends more largely upon the capacity between the adjacent metal wiring layers 4b rather than upon the adjacent barrier metal layers 4a or adjacent barrier metal layers 4c. The reason for this is that a larger amount of electric current flows into the metal wiring layer 4b than into the barrier metal layers 4a and 4c. More specifically, the film thickness W10 of the thin film 5a formed on the side of the metal wiring layer 4b can particularly be rendered substantially constant when the void 6 includes a part of the outer peripheral side thereof formed upper than the interface between the barrier metal layer 4c and the metal wiring layer 4b and another part of the outer peripheral side thereof formed lower than the interface between the barrier metal layer 4a and the metal wiring layer 4b. Consequently, variations in the capacity value between the wirings can be reduced even when the number of wirings 4 to be formed is large.

Since the metal wiring layer 4b has an underside 4bb which is wider than an upper surface 4ba thereof, the thin film 5a tends to be formed on the sidewall of the metal wiring layer 4b. Since the void 6 has a vacuum interior, the capacity between the adjacent wirings 4 can be rendered minimum.

The void 6 is formed so that a lower end 6b thereof is located lower than the interface between the barrier metal layer 4a and the metal wiring layer 4b. As a result, the capacity between the adjacent barrier metal layers 4a can particularly be reduced. Furthermore, since the void 6 is formed so that an upper end 6a thereof is located higher than the interface between the barrier metal layer 4c and the metal wiring layer 4b, the capacity between the adjacent barrier metal layers 4c can be reduced.

Figure 2:
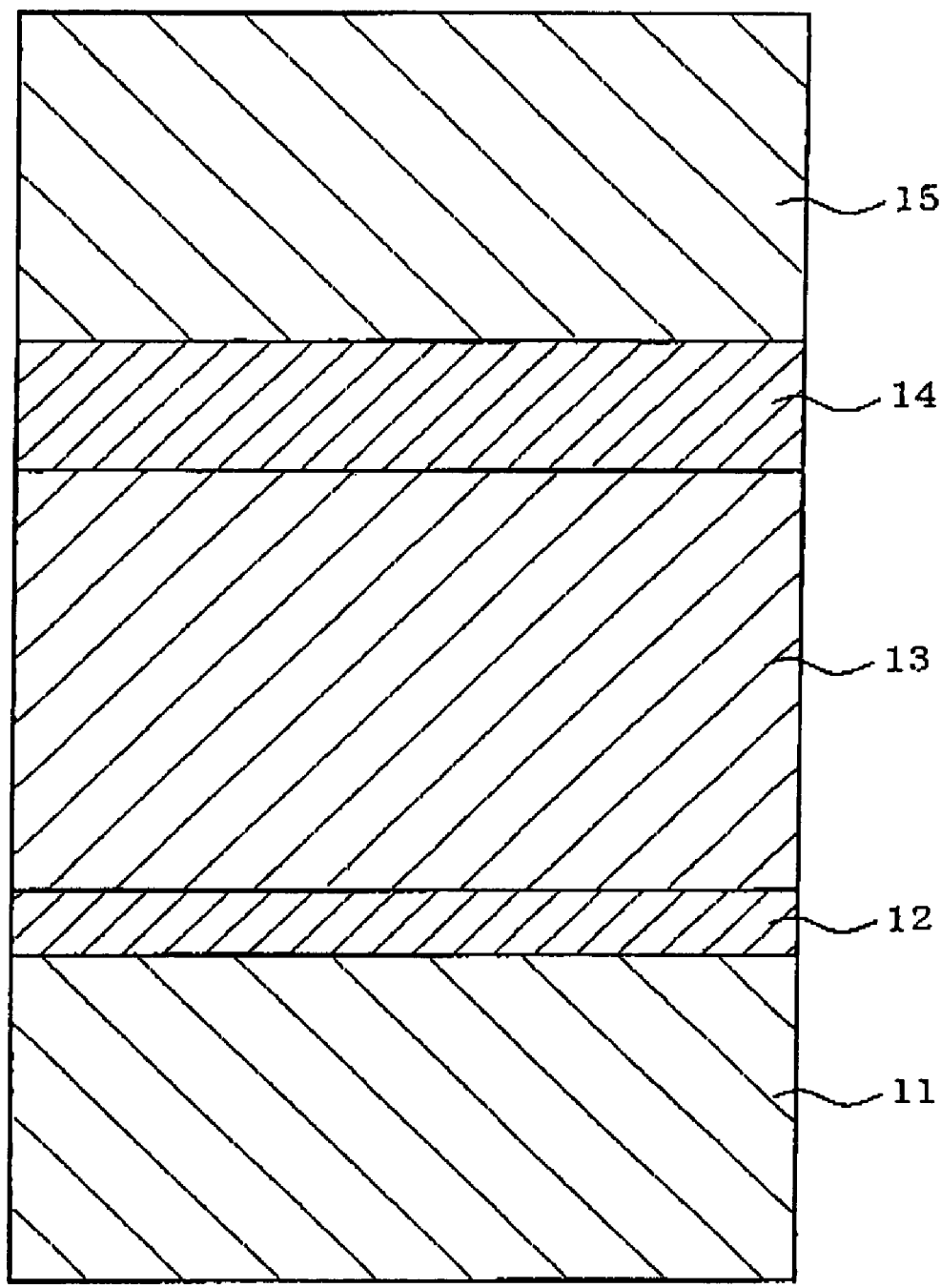
FIG. 2 is a schematic view showing a manufacturing process (No. 1)

The manufacturing process of the foregoing configuration will now be described with reference to FIGS. 2 to 5. As shown in FIG. 2, the lower barrier metal layer 12 is formed on the lower insulating layer 11, for example, by a sputtering process. The barrier metal layer 12 is formed so as to have, for example, a TiN/Ti laminated structure and has a film thickness of 20 nm, for example. The barrier metal layer 12 is formed into the barrier metal layer 4a.

Next, a metal layer 13 is formed on the barrier metal layer 12. The metal layer 13 is made from Al, for example and has a film thickness of 130 nm. The metal layer 13 is formed into the metal wiring layer 4b.

An upper barrier metal layer 14 is formed on the metal layer 13. The barrier metal layer 14 is formed so as to have, for example, a Ti/Ti laminated structure and has a film thickness of 40 nm, for example. The barrier metal layer 14 is formed into the barrier metal layer 4c.

A protective insulating layer 15 is then formed on the barrier metal layer 14. The insulating layer 15 is formed by the TEOS process and has a film thickness of 100 nm. The insulating layer 15 protects the barrier metal layer 14. The insulating layer 15 may be formed as needed when the barrier metal layer 14 is formed so as to be thicker than in the conventional structure (140 nm thick, for example).

Figure 3:
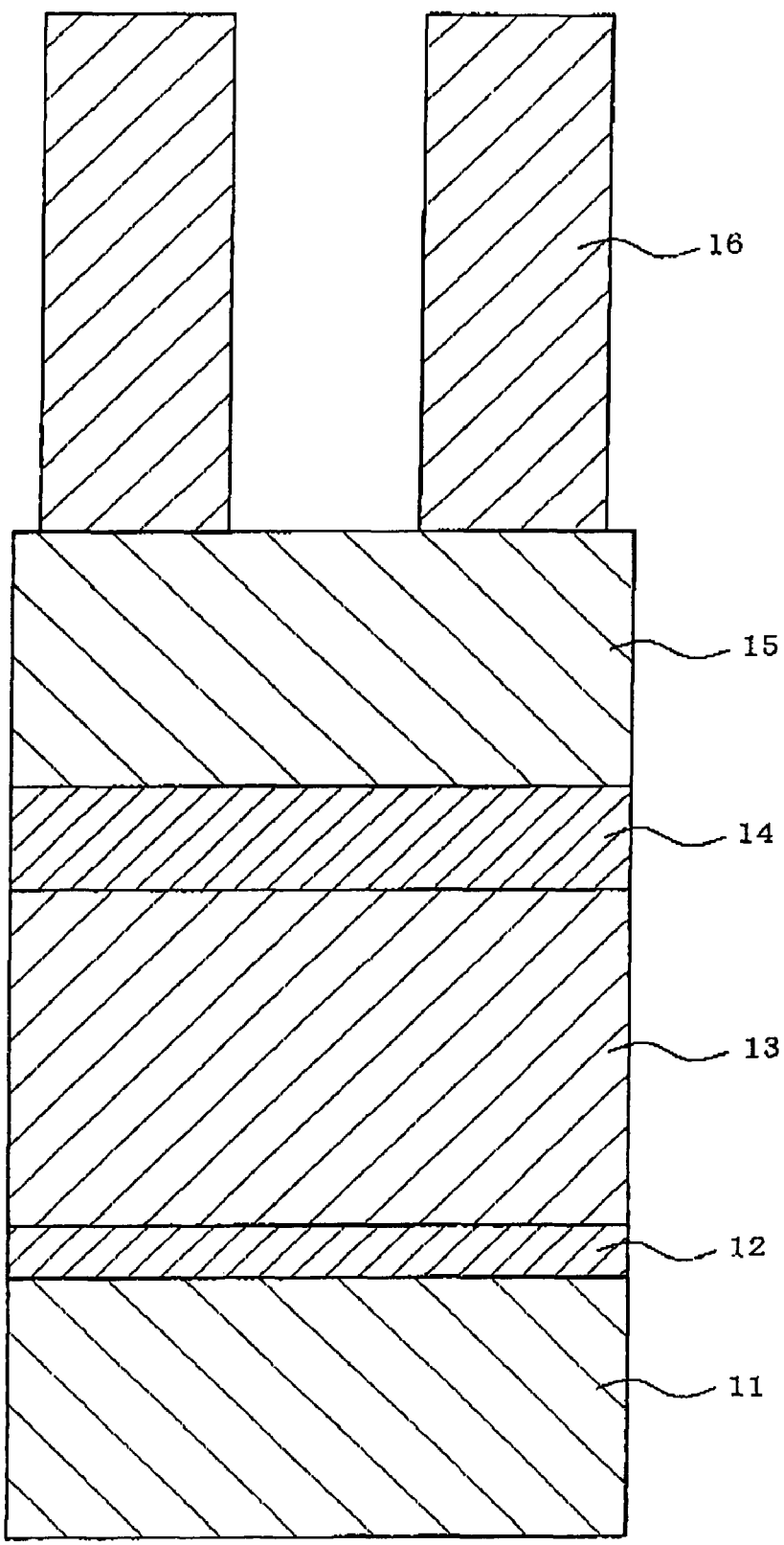
FIG. 3 is a schematic view showing a manufacturing process (No. 2)
Figure 4:
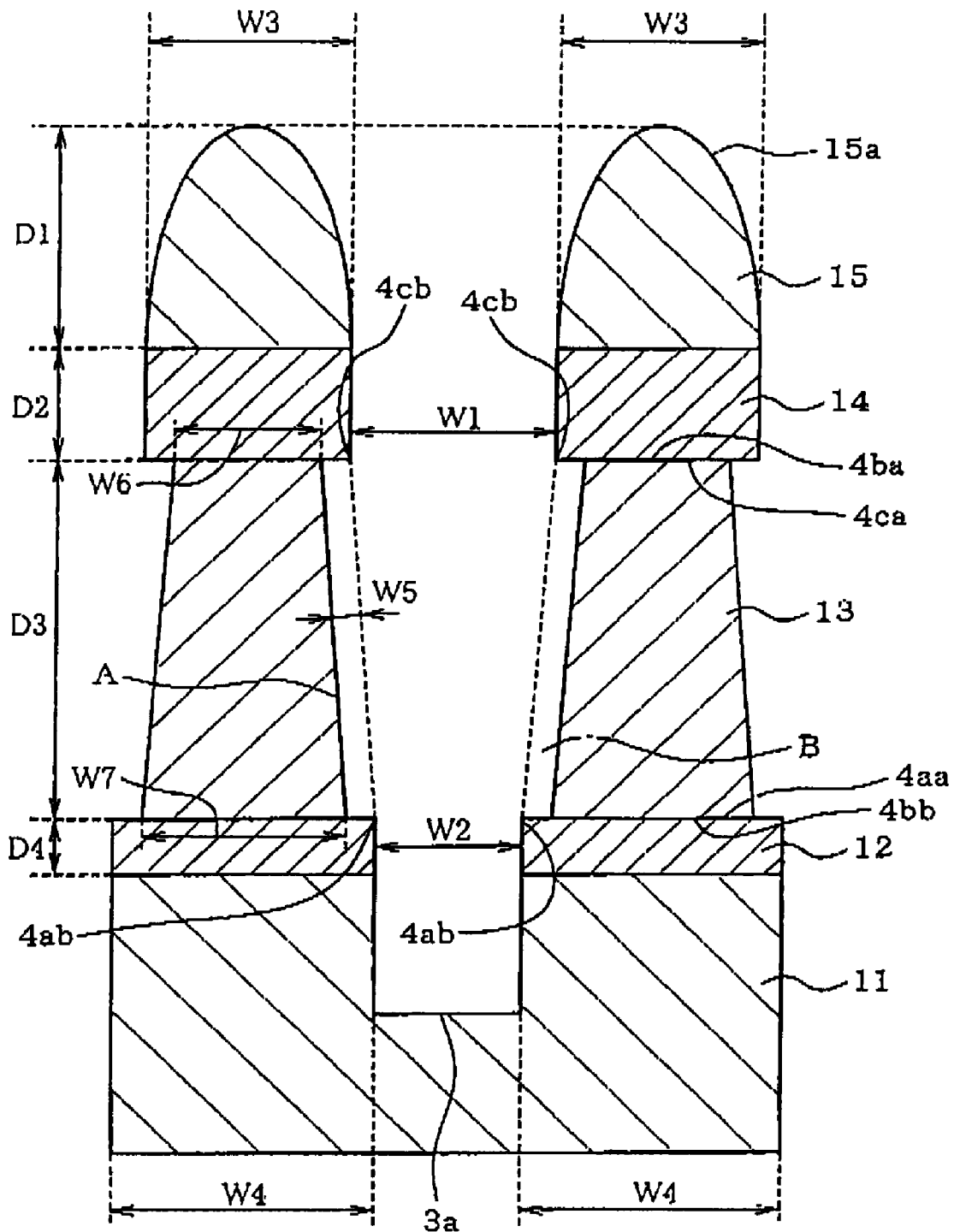
FIG. 4 is a schematic view showing a manufacturing process (No. 3)

Next, as shown in FIG. 3, a resist 16 is applied and patterned so that a mask pattern is formed. In this case, an opening width is set at 70 nm, for example. Subsequently, as shown in FIG. 4, the dry etching process (a reactive ion etching (RIE) process, for example)) is carried out to remove the insulating layer 15, the barrier metal layer 14, the metal layer 13, the barrier metal layer 12 and part of upper side of the lower-layer-side insulating layer 11 while the patterned resist 15 serves as a mask. As a result, the insulating layer 15, the barrier metal layer 14, the metal layer 13 and the barrier metal layer 12 are divided.

Subsequently, the resist 16 is delaminated by an ashing process, and a wet etching process is carried out so that a reactive product is removed. As the result of the wet etching process, transverse (horizontal) removal is applied to the metal layer 13 (see a removal region B in FIG. 4). Since an aspect ratio is high, a removal width is reduced as the process advances deeper (lower).

An upper end 15a remains in an upwardly curved shape in the insulating layer 15. The insulating layer 15 is formed into an insulating layer 5. Furthermore, the barrier metal layer 14 is formed into the barrier metal layer 4c. The barrier metal layer 4c has an end 4cb formed so as to protrude outward from the forming side of the upper surface 4ba of the metal wiring layer 4b. The sidewall surface of the metal layer 13 is cut as far as inside the straight line (see dotted line in FIG. 4) extending between the end 4cb of the barrier metal layer 4c and the end 4ab of the barrier metal layer 4a.

The barrier metal layer 12 corresponds to the barrier metal layer 4a. The barrier metal layer 4a has an end 4ab formed so as to protrude outward from a forming side of the underside 4bb of the metal wiring layer 4b. The reason for the aforementioned forming of the barrier metal layer 4a is that an etching speed against the sidewall of the metal layer 13 is higher than an etching speed against the barrier metal layers 4a and 4c. As the result of etching, the trench 3a is formed in the insulating layer 11. The insulating layer 11 corresponds to the insulating layer 3.

Referring to FIG. 4, a width W1 between the ends 4cb of the adjacent barrier metal layers 4c is set at 70 nm and a width W2 between the ends 4ab of the adjacent barrier metal layers 4a and 4c is set at 50 nm, for example. The barrier metal layer 4c has a width W3 which is set at 70 nm, whereas the barrier metal layer 4a has a width W4 which is set at 90 nm, for example. A distance W5 from the sidewall surface A of the metal wiring layer 4b to the straight line extending between the ends 4cb and 4ab is set at 10 nm, for example. Then, the metal wiring layer 4b has an upper end having a width W6 which is set at 50 nm and the metal wiring layer 4b has a lower end having a width W7 which is set at 70 nm, for example.

The barrier metal layer 4c has a film thickness D2 set at 40 nm and the barrier metal 4a has a film thickness D4 set at 20 nm, for example. Furthermore, the metal wiring layer 4b is formed so as to have a film thickness D3 set at 130 nm and the insulating layer 15 is formed so as to have a film thickness set at 100 nm, for example. After the etching process, the insulating layer 5 remains on the barrier metal layer 4c. In this case, the film thickness D1 remaining after the etching is 80 nm, for example.

Figure 5:
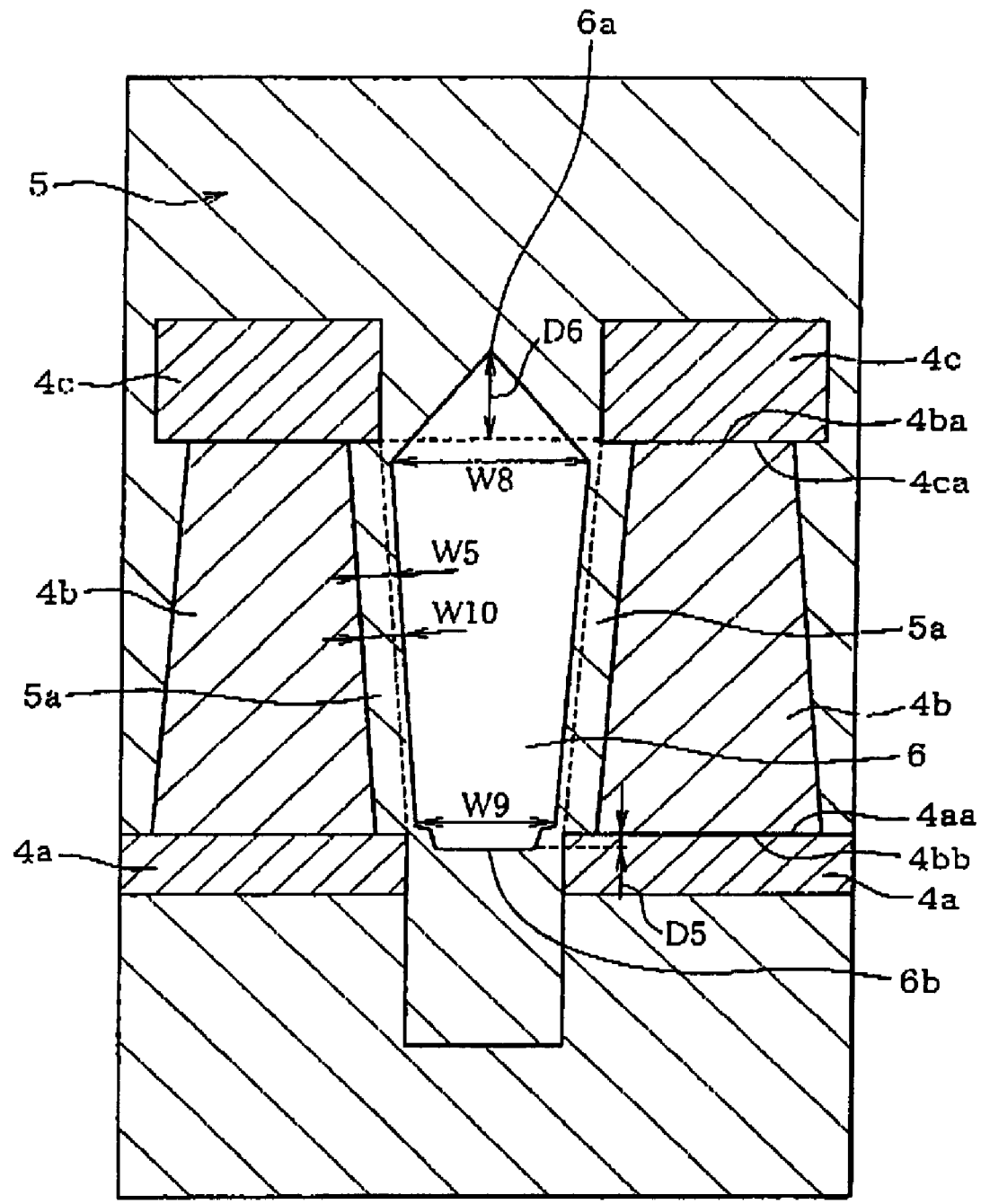
FIG. 5 is a schematic view showing a manufacturing process (No. 4).

Subsequently, as shown in FIG. 5, the insulating layer 5 is formed by a high-density plasma chemical vapor deposition (HDP-CVD) process. More specifically, the insulating layer 5 is deposited while the insulating layer 15 remains in an angle shape on the barrier metal layer 4c. Accordingly, the aspect ratio is rendered higher as compared with the conventional structure, whereupon the depositing efficiency is lowered. As a result, as shown in FIG. 5, the insulating layer 5 is formed as the thin film 5a with a film thickness uniform substantially on the whole side of the metal wiring layer 4b, and the void 6 is large laterally (or in the horizontal direction).

When the insulating layer 5 is formed by the HDP-CVD process, the insulating layer 5 is buried in a space between the adjacent barrier metal layers 4a and the adjacent barrier metal layers 4c (a burying step). A frontage of the buried region in which the insulating layer 5 has been buried by the burying step is spread by a sputtering step. It is desirable that the burying and sputtering steps are repeated alternately for forming the insulating layer 5. In this case, it is desirable that a film processing speed ratio of the burying step to the sputtering step is 10:1. When the ratio is 3:1, the formed void 6 is so small that the structure of the embodiment cannot be obtained. When the ratio is 10:1, a large void 6 can readily be formed between the adjacent wirings 4.

Furthermore, when the insulating layer 5 is formed by the HDP-CVD process, a gas flow rate may be set at $SiH_4/O_2=30/120$ [sccm] (sccm is an abbreviation of standard cc/min). It is more desirable to increase the gas flow rate to $SiH_4/O_2=90/360$ [sccm]. In this case, a large void 6 can readily be formed between the wirings 4.

FIG. 5 shows the dimensions measured after the forming process. The thin film 5a is formed along the side of the metal wiring layer 4b in FIG. 5. A maximum distance W8 (see FIG. 5) between the thin films 5a opposed to each other at the upper end 6a side of the void 6 is set at 80 nm, for example. A maximum distance W9 between the thin films 5a opposed to each other at the lower end 6b side of the void 6 is set at 60 nm, for example. The film thickness W10 of the thin films 5a formed on the side of the metal wiring layer 4b is set at 13 nm, for example. A minimum distance D5 refers to a distance from the interface between the underside 4ca of barrier metal layer 4c and the upper surface 4ba of the metal wiring layer 4b to the upper end 6a of the void 6. The minimum distance D5 is set at 5 nm, for example. A minimum distance D6 refers to a distance from the interface between the underside 4ca of the barrier metal layer 4c and the upper surface 4ba of the metal wiring layer 4b to an upper end 6a of the void 6. The minimum distance D6 is set at 15 nm, for example.

The sectional area of the void 6 is schematically obtained as follows: the sectional area of the metal wiring layer 4b is about 8000 [nm$^2$] and the sectional area of the void 6 is about 9000 [nm$^2$]. In this case, since the sectional area of the metal wiring layer 4b is smaller than the sectional area of the void 6, an increase in the capacity particularly between the adjacent wirings 4 can be prevented. The wiring structure can be configured with no problem regarding the electric characteristics of the circuit particularly.

The manufacturing method of the embodiment includes the following steps. The barrier metal layer 12 is formed on the lower side insulating layer 11. The metal layer 13 is formed on the barrier metal layer 12. The barrier metal layer 14 is formed on the metal layer 13. The protective insulating layer 15 is formed on the barrier metal layer 14. The resist 16 is formed on the insulating layer 15 and patterned. Dry etching is carried out for the insulating layer 15, barrier metal layer 14, metal layer 13, barrier metal layer 12 and insulating layer 11 with the patterned resist 16 serving as a mask. Wet etching is carried out so that reaction product due to the etching is removed and the sidewall surface of the metal layer 13 is also removed. The insulating layer 5 is formed between the adjacent wirings 4 by the HDP-CVD process so that the void 6 is formed so as to be located upper than the interface between the metal layer 13 and the barrier metal layer 14.

The above-described manufacturing method can form the void 6 larger than in the conventional structure, and the capacity between the adjacent wirings 4 can be rendered smaller. Moreover, the variations in the capacity can be reduced.

Furthermore, in the step of forming the insulating layer 5, the burying step and the sputtering step are repeated alternately. In the burying step, the insulating layer 5 is buried in the region between the adjacent barrier metal layers 4a and the adjacent barrier metal layers 4c. In the sputtering step, a frontage of the buried region in which the insulating layer 5 has been buried in the burying step is spread by a sputtering step. Since the burying and sputtering steps are repeated alternately, a larger void 6 can readily be formed. In this case, since the film processing speed ratio of the burying step to the sputtering step is 10:1, a larger void 6 can be formed more readily. Since the gas flow rate is set as SiH$_4$/O$_2$=90/360 [sccm] in film formation, a larger void 6 can be formed more readily.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of manufacturing a semiconductor device comprising:
    forming on a lower insulating layer first to third electrically conducting layers sequentially and a protective insulating layer when necessary;
    forming a mask pattern on the third conducting layer or the protective insulating layer;
    dry-etching the first to third conducting layers with the mask pattern serving as a mask, thereby dividing the conducting layers; and
    forming an insulating layer between the adjacent second conducting layers by an HDP-CVD process so that a void is defined so as to be located lower than an interface between the first and second conducting layers and higher than an interface between the second and third conducting layers so as to have a sectional area larger than the second conducting layer, wherein the forming of the insulating layer by the HDP-CVD process includes burying the insulating layer and sputtering thereby to spread a frontage of a buried region which has been buried by the burying process, both burying and sputtering being repeated alternately.

2. The method of claim 1, wherein a film processing speed ratio of the burying process to the sputtering process is 10:1.

3. The method of claim 1, wherein the forming of the insulating layer by the HDP-CVD process has a gas flow rate set as SiH$_4$/O$_2$=90/360 [sccm] in film formation.

4. The method of claim 2, wherein the forming of the insulating layer by the HDP-CVD process has a gas flow rate set as SiH$_4$/O$_2$=90/360 [sccm] in film formation.

5. A method of manufacturing a semiconductor device, comprising:
    forming a first insulating film;
    forming a first barrier metal layer on the first insulating film;
    forming a metal layer on the first barrier metal layer;
    forming a second barrier metal layer on the metal layer;
    etching the second barrier metal layer, the metal layer, the first barrier metal layer and the first insulating film by a dry etching method so that a plurality of wiring patterns are formed;
    etching the wiring patterns by a wet etching method so that a reactive product is removed, so that a first width of an upper end of the metal layer is smaller than a second width of a lower end of the second barrier metal layer and so that a third width of a lower end of the metal layer is smaller than a fourth width of an upper end of the first barrier metal layer; and
    forming a third insulating film between the wiring patterns so that a void is formed between the wiring patterns,
    wherein the void is defined so as to be located lower than an interface between the first barrier metal layer and the metal layer and higher than an interface between the metal layer and the second barrier metal layer; and
    wherein the forming of the third insulating film includes burying the third insulating layer and sputtering thereby to spread a frontage of a buried region which has been buried by the burying process, both burying and sputtering processes being repeated alternately.

6. The method of claim 5, wherein the metal layer includes an Al material.

7. The method of claim 5, wherein the first and second barrier metal layers include a TiN/Ti material.

8. The method of claim 5, wherein the forming of the third insulating film is performed by a HDP-CVD method.

* * * * *